United States Patent
Ravi et al.

(10) Patent No.: US 7,396,479 B1
(45) Date of Patent: Jul. 8, 2008

(54) METHOD FOR MANUFACTURING POROUS SILICON

(75) Inventors: Kramadhati Ravi, Atherton, CA (US); Alan M. Myers, Menlo Park, CA (US)

(73) Assignee: Intel Corporation, Santa Clara, CA (US)

( * ) Notice: Subject to any disclaimer, the term of this patent is extended or adjusted under 35 U.S.C. 154(b) by 832 days.

(21) Appl. No.: 10/883,466

(22) Filed: Jun. 30, 2004

(51) Int. Cl.
*B31D 3/00* (2006.01)
*H01L 21/30* (2006.01)
*H01L 21/46* (2006.01)

(52) U.S. Cl. .......................... 216/56; 438/458
(58) Field of Classification Search ............... None
See application file for complete search history.

(56) References Cited

U.S. PATENT DOCUMENTS

| | | |
|---|---|---|
| 6,406,981 B1 | 6/2002 | Ravi |
| 6,960,285 B2 | 11/2005 | Schoeniger et al. |
| 7,091,108 B2 * | 8/2006 | Tolchinsky et al. ......... 438/458 |
| 2003/0062149 A1 | 4/2003 | Goodson et al. |
| 2003/0085024 A1 | 5/2003 | Santiago et al. |
| 2003/0147225 A1 | 8/2003 | Kenny, Jr. et al. |
| 2003/0164231 A1 | 9/2003 | Goodson et al. |
| 2003/0173942 A1 | 9/2003 | Kenny, Jr. et al. |

OTHER PUBLICATIONS

USPTO Office Action, dated Feb. 25, 2008, for U.S. Appl. No. 10/883,469.

* cited by examiner

*Primary Examiner*—Roberts Culbert
(74) *Attorney, Agent, or Firm*—Troutman Sanders LLP; James Hunt Yancey, Jr.

(57) ABSTRACT

A method for preparing porous silicon in which an oxidized single crystal silicon wafer is first bonded to a polycrystalline wafer. The oxidized high quality wafer is then thinned to the desired thickness by grinding and polishing. An oxide may then be deposited on the wafer and patterned to expose regions were the porous silicon will be formed. The single crystal silicon wafer may then etched in the unmasked areas of the pattern to thin the single crystal silicon wafer to the desired thickness in the range of 0.1 microns to 1.0 microns. Next, the porous silicon may be formed using standard techniques. Once the porous silicon is formed the polycrystalline silicon wafer may be ground away and the oxide layer may be undercut to expose the porous silicon. Finally, an appropriate liner material may be applied to the porous silicon.

18 Claims, 9 Drawing Sheets

METHOD FOR MANUFACTURING POROUS SILICON

CROSS-REFERENCE TO RELATED APPLICATIONS

This application is related to U.S. patent application Ser. No. 10/883,469, entitled "Method and Apparatus for Improved Pumping Medium for Electro-Osmotic Pumps," filed on Jun. 30, 2004.

BACKGROUND

Electro-osmotic pumps operate on the principle that the application of an electric field across a pumping medium, in the presence of a liquid may cause the bulk of the liquid to flow through the pumping medium. This is based on the principle electro-osmotic flow. For the case of water in contact with silicon dioxide or glass, the solid surface may acquire a finite charge density known as an electrical double layer when in contact with the aqueous solution through the deprotonation of silanol groups. As a charge is applied across the pumping medium, the ions will flow from the anode to the cathode and drag the bulk of the aqueous solution with it, creating a positive flow.

Recently, electro-osmotic pumps have been proposed for use with microelectronic devices. For instance, published U.S. patent application Ser. No. 10/053,859 to Goodson, et al., Publication No. 2003/0062149, published on Apr. 3, 2003 describes using electro-osmotic pumps for thermal regulators for microelectronics devices. The electro-osmotic pump that may be used with microelectronic devices that are capable of generating high pressure and flow without moving mechanical parts and the associated generation of unacceptable electrical and acoustical noise.

U.S. Patent Application Publication No. 2003/0147225 to Thomas William Kenny, Jr. et al., describes a method for integrating thermal management of microelectronic devices within the microelectronic device. Therefore, instead of being an "add-on" device, the electro-osmotic pump may be integrated within the microelectronic device.

Published U.S. patent application Ser. No. 10/272,048 to Juan G. Santiago et al., Publication No. 2003/0085024, published on May 8, 2003 describes a method for removing excess gases from closed loop electro-osmotic pumps. The method includes using a gas permeable membrane, which removes and vents electrolytic gases generated by the fluid chamber within the electro-osmotic pump. A catalyst may be used to recombine the electrolytic gases to form a vapor product that may be vented or condensed back to a liquid. The condensed electrolytic vapors may then be passed through an osmotic membrane back to the fluid chamber.

Published U.S. patent application Ser. No. 10/384,000 to Thomas William Kenny Jr. et al., Publication No. 2003/0173942, published on describes an apparatus that integrates the power management module and a thermal management module, such as an electro-osmotic pump, may then be affixed directly to a power consuming microelectronic device.

Published U.S. patent application Ser. No. 10/385,086 to Kenneth E. Goodson et al., Publication No. 2003/0164231, published on Sep. 4, 2003, describes an apparatus for controlling the thermal management of a microelectronic device through electrically controlling the flow of cooling liquid through the pump to minimize the spatial and temporal temperature variations that may occur on the microelectronic device.

However, high-flow electro-osmotic pumps currently for use in microelectronic devices may be constructed using sintered packed-particle porous glass frits as the pumping medium. These glass frits may have a thickness of approximately one to four millimeters, a pore diameter of approximately 1 micrometer, a porosity of approximately 0.2 and a tortuosity of about 1.4. Unfortunately, these pumping medium characteristics may not be ideal for optimizing the pumping action of a high-flow, high-pressure electro-osmotic pump. For example, it may be desirable for the pumping medium to have a pore diameter significantly smaller than 1 micron, and the tortuosity values approximately unity to achieve increased flow rates and pressure per unit area for a given applied voltage. Furthermore, the fabrication of the packed porous oxide frits currently used for electro-osmotic pumps may not be compatible with standard microfabrication processes. These drawbacks may hinder the use of electro-osmotic pumps as effective cooling systems for current and future microprocessors and Microsystems.

DETAILED DESCRIPTION OF THE EMBODIMENTS

Figure 1:
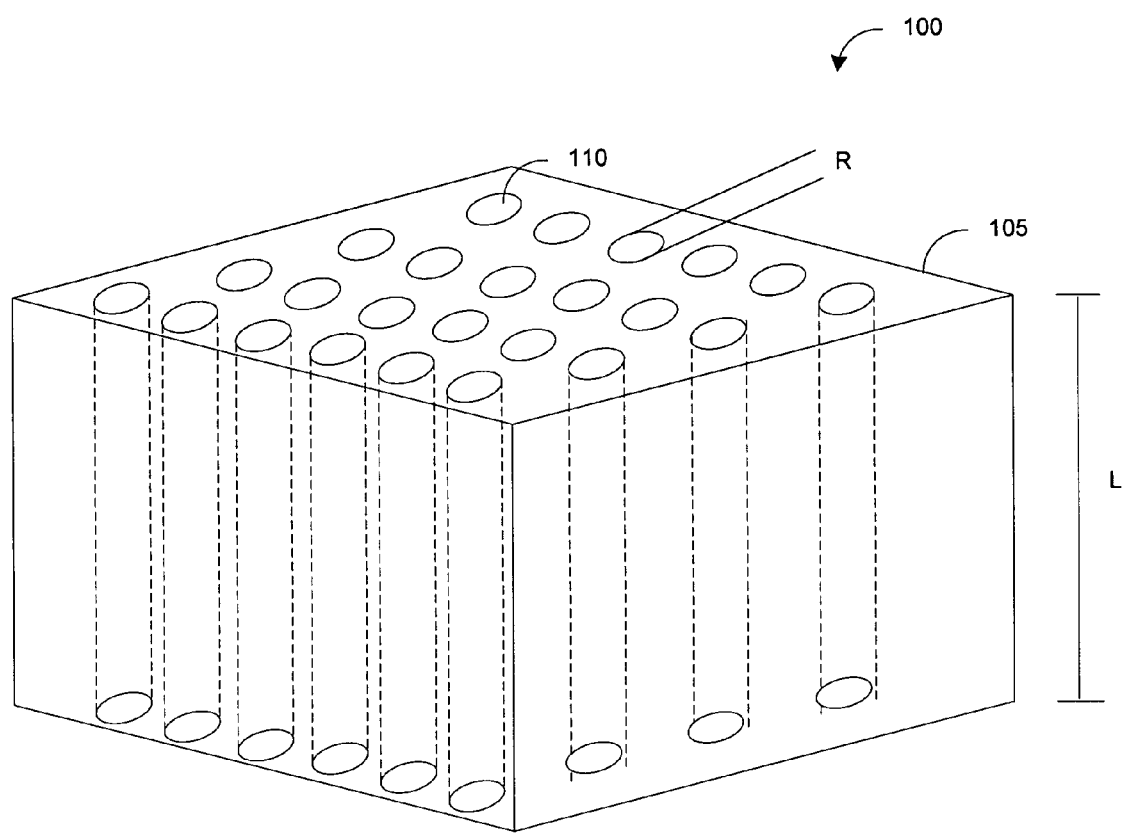
FIG. 1 is a block diagram of porous silicon in accordance with some embodiments of the present invention.

FIG. 1 is a block diagram illustrating porous silicon pumping medium 100 in accordance with some embodiments of the invention. The porous silicon pumping medium 100 may be used as a pumping medium for an electro-osmotic pump, which is described below. Although porous silicon pumping medium 100 may be commonly fabricated for such application as optoelectronic devices, electroluminescent devices, membranes, Bragg reflectors, Fabry-Perot filters, gas sensor, sacrificial layers in micro elector-mechanical (MEMs) fabrication, active biomaterial, anti-reflective coatings, and explosives, porous silicon pumping medium 100 has not been developed as a pumping medium for electro-osmotic pumps. The porous silicon pumping medium 100 may be fabricated from single crystal silicon 105, which after the porous silicon fabrication process contains a number of pores 110 having a diameter, D. To be effective as a pumping medium for an electro-osmotic pump, the pumping medium should contain a large number of pores, while being very thin and having a tortuosity close to unity. Additionally, the diameter, D, of the individual pores 110 of the porous silicon may be in the range of approximately 0.1 microns to 5.0 microns. The pore diameter can be altered to obtain the desired flow rate and pressure for the pump application. This allows for the porous silicon to be able to have a pore density, that is, the number of pores per unit area, in the range of approximately thirty percent (20%) to approximately eighty percent (80%). The porous silicon pumping medium 100 may be fabricated to have a thickness, L, in the range of approximately 10 microns to 500 microns. Furthermore, because porous silicon may be fabricated using well-known microelectronic fabricating techniques, the thickness, L, of the porous silicon and consequently the length of the pores, may be readily controlled to tighter tolerances than may be achieved with conventional glass frits. For example, typical glass frits may have a thickness of approximately 1-4 millimeters. However, the conventional silicon fabrication process may allow the porous silicon to have a thickness, L, and subsequently the pore length, to be manufactured in the range of approximately 10 to 500 microns. Moreover, the conventional silicon fabrication process allows for the porous silicon to have a tortuosity, T, approximately equal to unity, which may be optimal for a pumping medium in an electro-osmotic pump.

The porous silicon pumping medium 100 may also be coated with an insulating liner material (not shown) in order to prevent current from passing through the solid structure of the porous silicon and to tailor the pore diameter to produce to desired pressure and flow requirements of the pump. Electro-osmotic pumps depend upon the creation an electrical double layer, which may be characterized by a quantity known as the Zeta potential. The Zeta potential may be altered by the choice of the liner material, and consequently a suitable liner material may be deposited on the surface and inside the pores of the porous silicon substrate. For example, the thickness of the liner material may be adjusted to provide a specific operating pressure and flow rate for the electro-osmotic pump. For instance, if the electro-osmotic pump requires a high operating pressure and a low flow rate, then the thickness of liner material deposited within the pores may be increased. Conversely, if the electro-osmotic pump requires a lower operating pressure and a higher flow rate, the diameter of the pores may be increased by reducing the thickness of the liner material. The liner material may be either an oxide, a nitride, or a polycrystalline layer which is subsequently oxidized. The insulating layer may also be a polymeric material such as parylene. In one embodiment, the liner material may be silicon dioxide ($SiO_2$), which may be grown by thermally oxidizing the porous silicon substrate. In another embodiment, the $SiO_2$ layer may be grown by depositing at least one layer of low pressure chemical vapor deposition (LPCVD) polycrystalline silicon and then subsequently oxidizing the layer of polycrystalline silicon. In yet another embodiment, the liner material may be silicon nitride ($SiN_2$), which may be deposited through standard LPCVD processes. The liner material may have a thickness in the range of approximately 0.1 microns to 5 microns.

Figure 2:
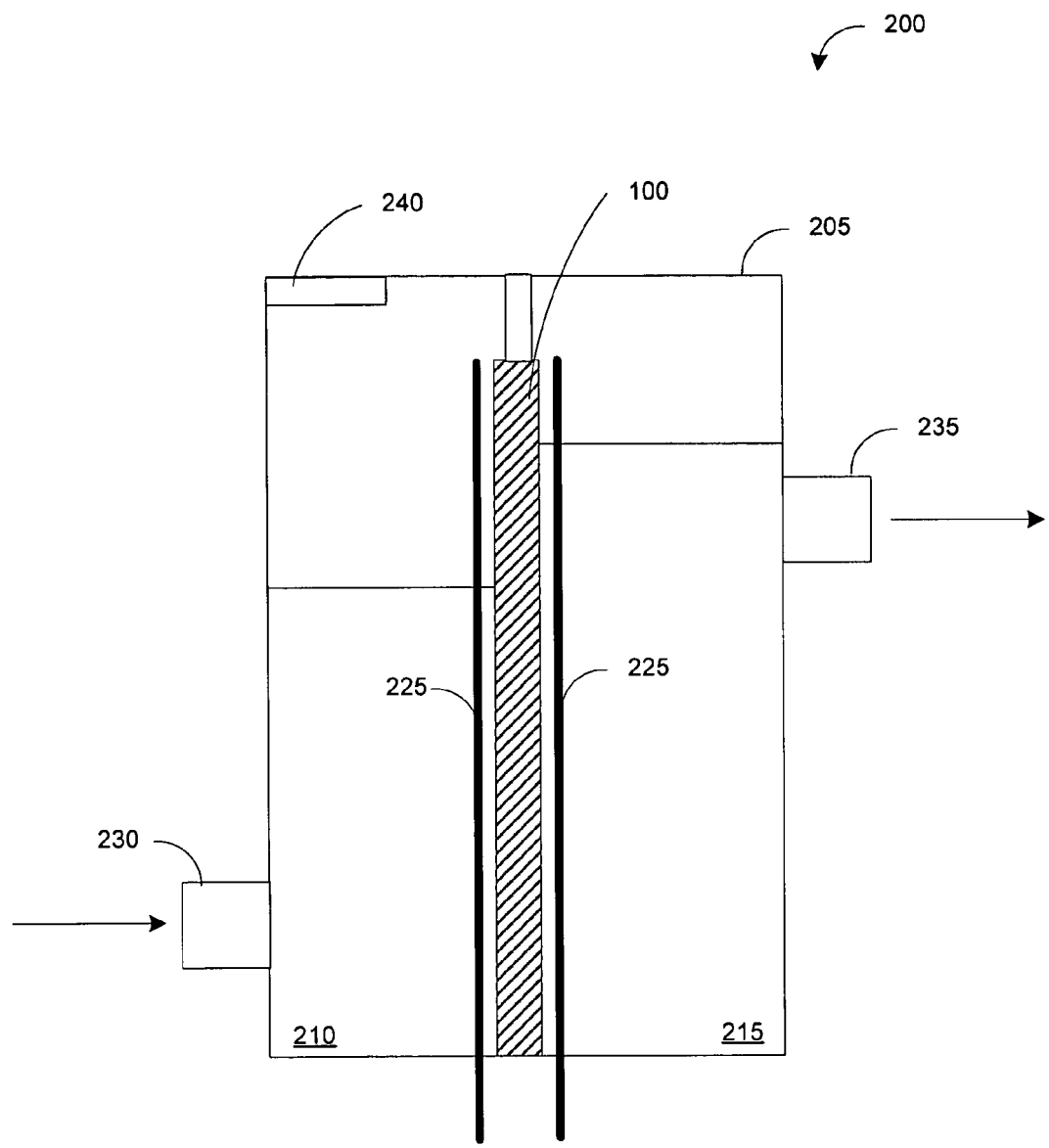
FIG. 2 is a block diagram illustrating an exemplary electro-osmotic pump using porous silicon in accordance with some embodiments of the present invention.

FIG. 2 is a block diagram illustrating an exemplary electro-osmotic pump 200 in accordance with some embodiments of the present invention. The electro-osmotic pump 200 may include a container 205 that has a first chamber 210 and a second chamber 215. The electro-osmotic pump 200 may also have a porous silicon pumping medium 100 that may separate the first chamber 210 and the second chamber 215. A pair of electrodes 225 may be proximate to the porous silicon pumping medium 100 to allow a voltage to be applied across the porous silicon pumping medium 100. In some embodiments of the present invention, the electrodes 225 may be made of platinum (Pt). The container 205 may then be filled with an aqueous solution, such as de-ionized water or alcohol. As an electric field is applied across the electrode pair 225, mobile ions in the aqueous solution are forced by the electric field to migrate from positive electrode to the negative and electrode through the porous silicon pumping medium 100. The flow of the mobile ions may be great enough through the porous silicon pumping medium 100 to force the bulk of the aqueous solution through porous silicon pumping medium 100 from the first chamber 205 to the second chamber 210. The flow of the aqueous solution from the first chamber 205 to the second chamber 210 may create a pressure differential across the porous silicon pumping medium 100, wherein the pressure in the first chamber 205 may be lower than the pressure in the second chamber 210.

Because oxygen and hydrogen molecules may be generated at the pump electrodes 225 as the result of electrolysis when a voltage is applied across the electrodes 225, the electro-osmotic pump 200 may also include a catalytic gas recombiner to recombine oxygen and hydrogen atoms into water. The majority of the hydrogen gas molecules may be dragged with the flow of the bulk aqueous solution out through an outlet valve 235 of the second chamber 210 and through the system. The hydrogen gas may then return to the first chamber 205 through the inlet valve 230. Once inside the hydrogen gas will rise to the top of the chamber where it and the oxygen molecules may come in contact with the catalytic gas recombiner and reform as de-ionized water. Additionally, the electro-osmotic pump may also include a membrane 240. The membrane may be a hydrophilic TEFLON® membrane or the like. The membrane 240 may allow at least some hydrogen gas molecules that escape from the aqueous solution in the second chamber 210 to pass back to the first chamber 205 and combine with the oxygen gas molecules in the presence of the catalytic gas recombiner to form de-ionized water.

Using the porous silicon pumping medium 100 as the pumping medium in the electro-osmotic pump may provide several advantages over glass frits, which are currently used as the pumping medium in electro-osmotic pumps. First, because the porous silicon pumping medium 100 may be made much thinner than glass frits, the electro-osmotic pump may be operated at a reduced operating voltage while producing a large electric field. For instance, if the electro-osmotic pump operates at a pressure of five pounds per square inch (psi), the pumping voltage may be between 20 and 50 volts, which is reduced from the pumping voltage required for conventional glass frits. Second, the thickness of the porous silicon pumping medium may be made much thinner and the area required to obtain a specified amount of flow may be smaller for the porous silicon pumping medium 100 than the thickness of conventional glass frits thereby decreasing the volume of the pump. Additionally, the pore diameters of the porous silicon pumping medium 100 may also be made much smaller than the pores in a conventional glass frit.

Figure 3:
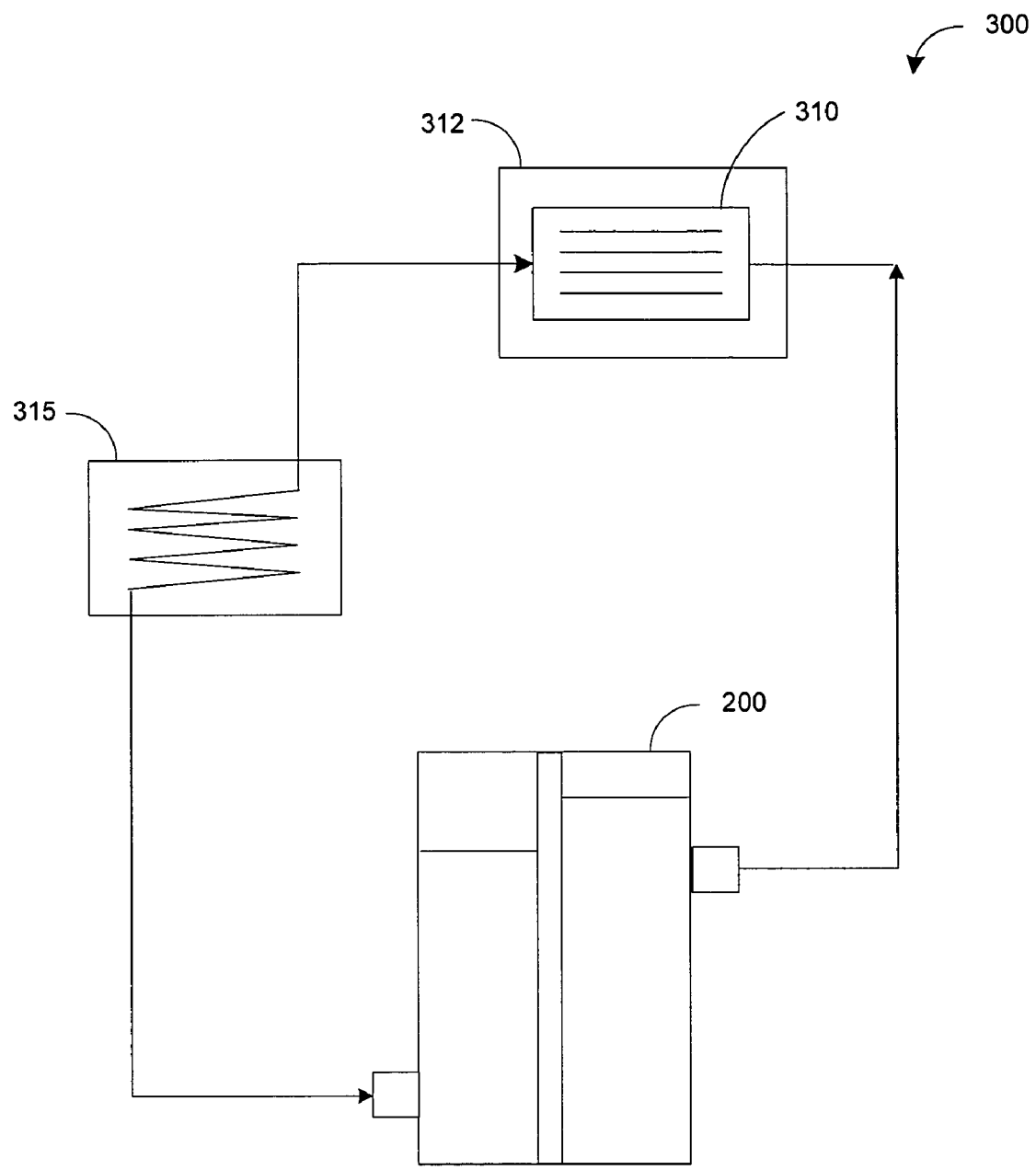
FIG. 3 is block diagram illustrating an exemplary operating environment using some embodiments of the present invention.

FIG. 3 is a block diagram illustrating a system 300 utilizing an electro-osmotic pump 200 in accordance with some embodiments of the present invention. The system 300 may be a closed loop system, which may include an electro-osmotic pump 200, which pumps cooling liquid through the system, a heat exchanger 310, and a heat rejector 315. As an electric field is applied to the electro-osmotic pump 200, ions in the aqueous solution within the closed system 300 move across the porous silicon pumping medium 100. The ion drag of the aqueous solution may cause the bulk of the aqueous solution to be pulled through the system 300. The aqueous fluid may then pass through the heat exchanger 310, which may be attached to a microelectronic device 312, such as a microprocessor, memory device, or any other integrated chip device that requires the removal of a large amount of heat during operation. As the fluid passes through the heat exchanger 310, the heat generated by the operation of the microelectronic device 312, may be absorbed by the aqueous solution passing through the heat exchanger 310. The heated aqueous solution may then pass to the heat rejector 315, where the heat may be dissipated from the aqueous fluid so that when the aqueous fluid leaves the heat rejector 315, it is cooled. The cooled aqueous fluid may then flow back to the electro-osmotic pump 200, where the aqueous solution may be pumped back through the system 300. Thus, in this manner, the cooled aqueous solution may be continually passed through the system 300 to remove excess heat from the microelectronic device 312.

Figure 4:
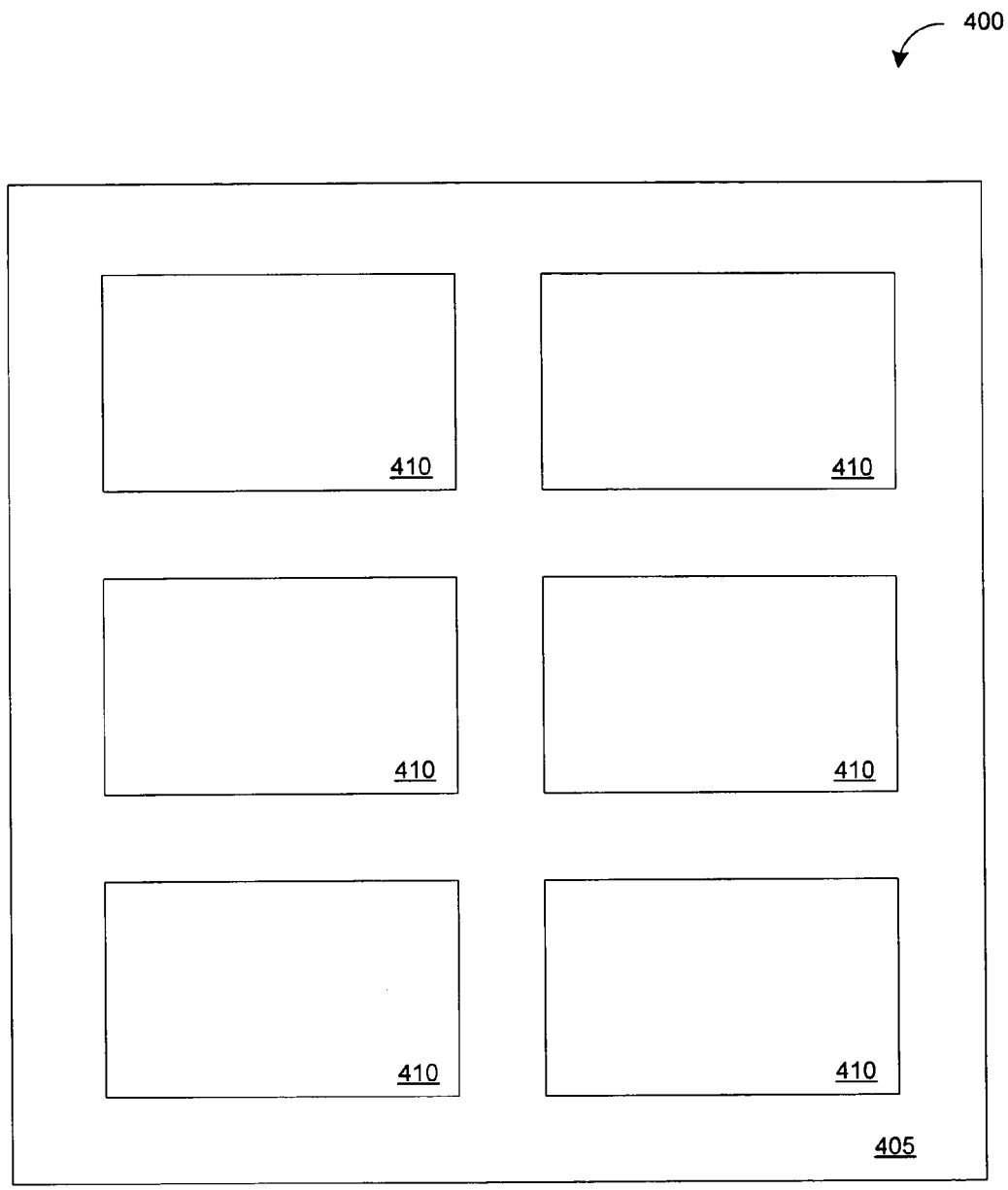
FIG. 4 is a block diagram illustrating a cross-section of a porous silicon pumping medium in accordance with some embodiments of the invention.

FIG. 4 is a block diagram illustrating a porous silicon pumping medium 100 in accordance with some embodiment of the present invention. The porous silicon pumping medium 100 may be fabricated from a single crystalline silicon wafer, which is described below in detail. The porous silicon pumping medium 100 may include a number of porous silicon regions 410, which may be rectangular is shape. Although the porous silicon regions 410 are described as being rectangular in shape, those skilled in the art will appreciate that the porous silicon regions 410 within the porous silicon pumping medium 100 may be any shape, such as square, circular, oval, or any other shape without departing from the scope of the invention. In one embodiment, the porous silicon pumping medium 100 may be divided into six rectangular porous silicon regions 410 and separated by rigid support 405. Although the porous silicon pumping medium 100 is described as being divided into six porous silicon regions 410, those skilled in the art will appreciate that the porous silicon pumping medium 100 may be divided into any number of porous silicon regions 410 without departing from the scope of the invention.

Porous silicon may be brittle and may easily break under the pressure created during the electro-osmotic process. For instance, if the entire porous silicon pumping medium 100 was made a single, continuous piece of porous silicon, the porous silicon pumping medium 100 may lack the mechanical strength to withstand the pressure difference created in the electro-osmotic pump. If the pressure difference between the input region and the output region of the electro-osmotic pump increases too much, the porous silicon pumping medium 100 may fracture. To prevent the porous silicon pumping medium 100 from breaking, the regions of porous silicon 410 may be separated by rigid support regions 405. The rigid supports 405 may be used to provide strength to the porous silicon pumping medium 100. The rigid supports 405 may be formed of solid silicon by applying an appropriate mask during the etching process. However, the rigid supports 405 may also include other materials, such as metals, polymers, ceramic, and the like either embedded in the silicon wafer or adhered to the silicon wafer.

Figure 5:
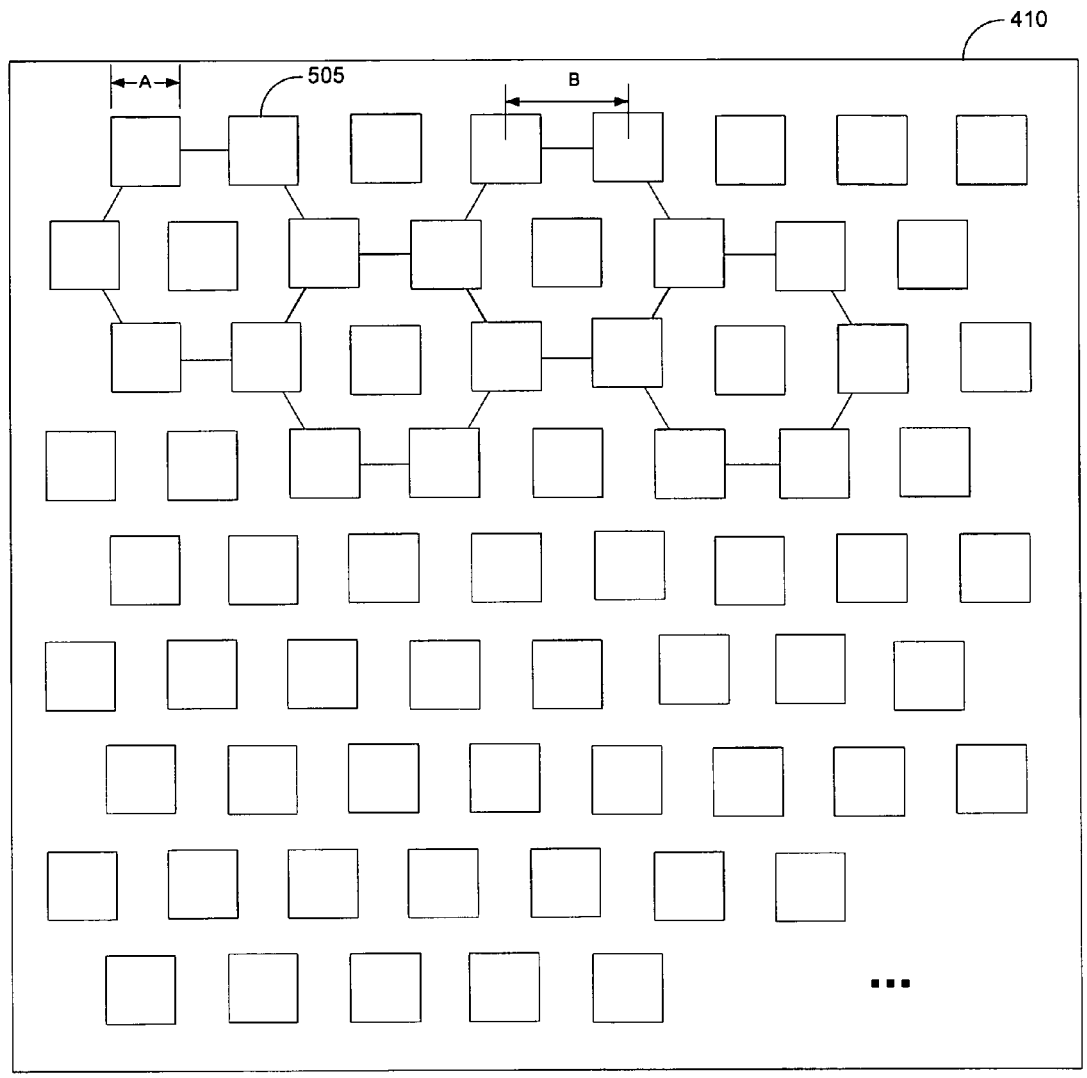
FIG. 5 is a block diagram illustrating a pattern for forming pores interconnected with a support structure for generating porous silicon in accordance with some embodiments of the present invention.

FIG. 5 is a diagram illustrating an etching pattern 500 for forming the pores of the porous regions 410 of the porous silicon pumping medium 100 according to some embodiments of the present invention. Each of the porous regions 410 may be further broken down into smaller regions 505 that may be used to form nucleation sites for the pores in the porous silicon. The liner material may be etched away allow access to the silicon to form the individual pores. In one embodiment of the present invention, the smaller regions 505 may be squares arranged in a hexagonal array. The area between each of the smaller regions 505 may be masked with the liner material so that the silicon between the smaller regions 505 will not be etched away during the formation of the pores at each nucleation site within the smaller regions 505. The silicon between the smaller regions 505 may provide the pore walls, which in turn may provide additional mechanical strength to the porous silicon pumping medium 100.

The sides of each smaller regions 505 may be defined by a dimension A. In some embodiments of the present invention, the dimension A may be approximately two (2) microns. Additionally, the smaller regions 505 may have a center-to-center distance of dimension B. In some embodiments of the present invention, the center-to-center length, B, may be in the range of approximately three (3) microns to eight (8) microns. Although the dimensions A and B have been described as 2 microns and 3-8 microns, respectively, those skilled in the art will appreciate that other lengths may be use for the dimensions A and B as required to obtain the necessary area for the porous silicon and the required mechanical strength without departing from the scope of the invention.

Figure 6:
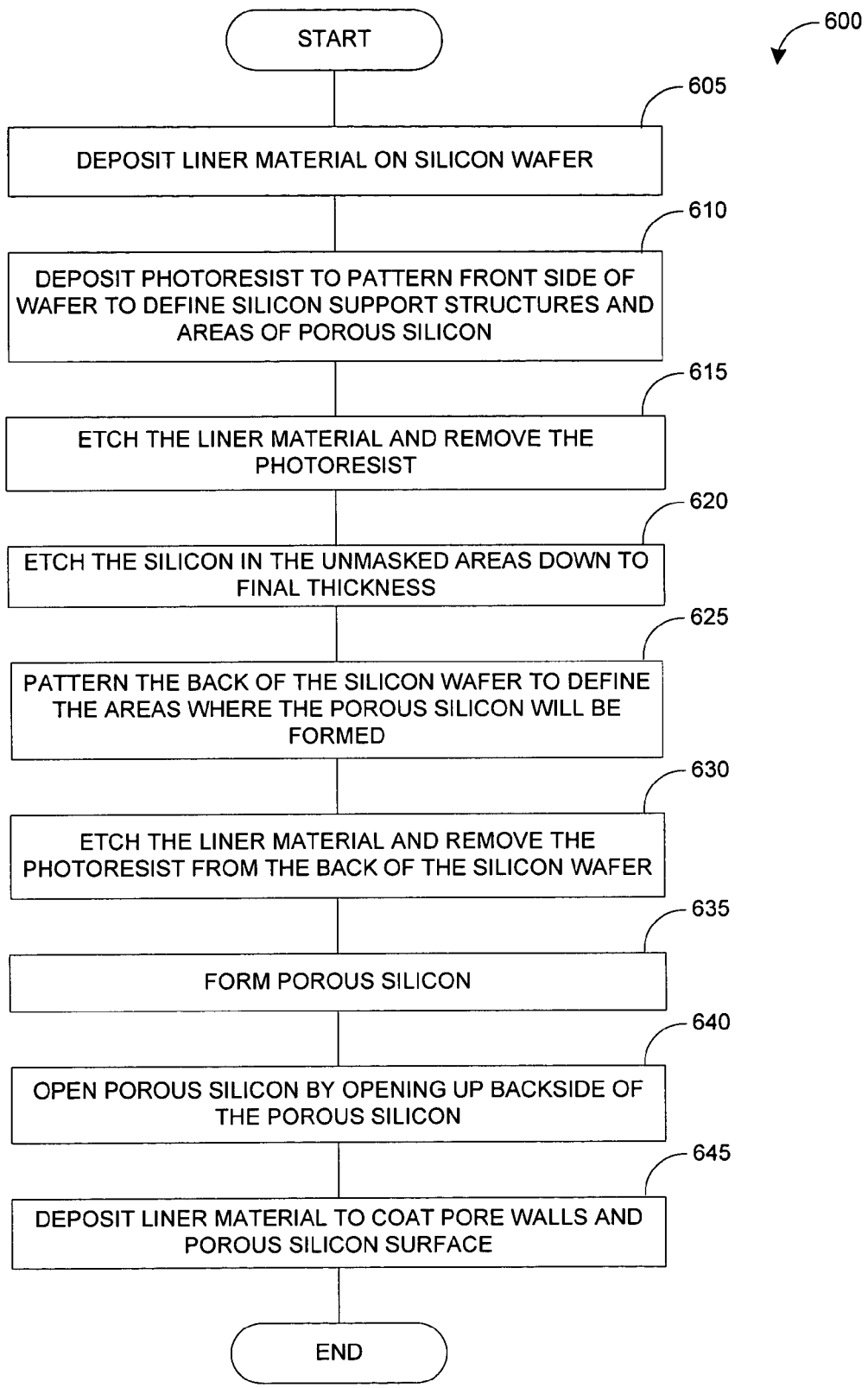
FIG. 6 is a logic flow diagram illustrating a method for manufacturing porous silicon for use in electro-osmotic pumps in accordance with some embodiments of the present invention.

FIG. 6 is a logic flow diagram illustrating a method 600 for manufacturing porous silicon in accordance with some embodiments of the present invention. Method 600 begins at 605, with a standard crystalline silicon wafer. A liner material may then be applied to the surface of the silicon wafer so that the liner material may enclose the silicon wafer. Examples of liner materials may be thermally deposited oxides, such as silicon dioxide ($SiO_2$) nitrides, such as silicon nitride ($SiN_2$) that may be deposited on the silicon wafer using low pressure chemical vapor deposition (LPCVD) processes. However, those skilled in the art will appreciate that other insulating materials, such as titanium oxide ($TiO_2$), tin oxide ($SnO_2$), titanium nitride ($TiN_2$) and other oxides or nitrides may be used without departing from the scope of the invention.

At 610, a photoresist layer may be deposited on front side of the silicon wafer to define a pattern for forming the porous silicon pumping medium 100. The pattern may consist of an array of porous silicon regions 410 separated by a number of stiffener regions 405. For example, in one embodiment, the geometric regions may be rectangular in shape regions and may be separated by regions of solid silicon to act as stiffener regions 405 to reinforce the porous silicon pumping medium 100. Within each porous silicon region, an additional pattern 500 may be formed that may define the nucleation sites 505 for the individual pores. The pattern may consist of a number of geometric shapes. In one embodiment, the geometric shapes may be squares. Additionally, the geometric shapes may be rectangles, circles, ovals, pentagons, hexagons, or the like. The geometric shapes may be arranged in a predefined array. In one embodiment the geometric shapes may be arranged in a hexagonal pattern array. However, those skilled in the art will appreciate that other array patterns, such as a circular array, a pentagonal array, and the like, may be used without departing from the scope of the invention.

At 615, the liner material on the front of the silicon wafer may be etched to reveal the silicon where the porous silicon may be formed. The liner material may be etched using an anisotropic reactive ion etcher, which is known in the art.

Etching the silicon liner layer may be performed using a deep reactive ion etcher. Next, the photoresist layer may be removed using standard plasma/ash etch process or any other suitable process for removing photoresist films. Once the photoresist layer has been removed, the silicon wafer may be dipped in a solution of tetramethylammonium hydroxide or potassium hydroxide (KOH) for a predetermined period of time. For example, the silicon wafer may be dipped in the KOH solution for approximately 5 minutes. The KOH solution interacts with the exposed silicon at the areas defined by the mask for the nucleation sites 505. The KOH solution may selectively etch the crystalline silicon along the 111 planes, which may cause a small inverted pyramid to form at each nucleation site 505.

At 630, the liner material on the backside of the crystalline silicon wafer may be etched to reveal the crystalline silicon to define the areas where the porous silicon may be formed. The liner material may be etched using a wet etch technique or standard plasma etching techniques At 635, the porous silicon may be formed in the silicon wafer using standard techniques. The standard techniques will vary depending on whether the silicon is n-type of p-type. For example, if the silicon wafer is formed from an n-type silicon material, a pair of contacts may be placed on the opposites sides of the backside of the silicon wafer. The backside of the silicon wafer may then be exposed to light to generate holes in the silicon wafer. Once the holes are generated, the voltage may be applied to the electrical contacts, while an etching solution, such as ethanol and hydrofluoric acid (HF) may be applied to the topside of the silicon wafer. The tips of the inverted pyramids act as electric field concentrators and define the location of each pore. In the presence of the electric field the HF may etch the crystalline silicon along the path of the holes to form the pores. The current may be applied for a period of time to reach a desired depth for the pores. In some embodiments of the present invention, the pores may be etched at a rate of approximately 1 micron per minute. Thus, in order to obtain a desired pore length of approximate 2-400 microns, the voltage across the silicon wafer would have to be maintained for approximately 2-400 minutes.

Alternatively, if the crystalline silicon is p-type, that is it is doped with an atom such as boron, then the back side of the silicon wafer would not have to be illuminated to create the holes. Rather, only a voltage would have to applied across the silicon wafer. Once again, a voltage may be applied to the electrodes while the top of the silicon wafer is covered with HF and ethanol. The HF will etch the silicon at the pore nucleation sites and follow the hole path downward through the crystalline silicon to create the pores.

During the pore formation, the process may be stopped before the HF etches through the backside of the silicon. If the formation of pores were to break through backside the silicon wafer, the HF may spill through the silicon wafer, which may lead to contamination of the production facility. Therefore, it may be desirable to stop the pore formation, so as to leave a layer of silicon approximately 5-100 microns thick on the backside of the silicon wafer to contain the HF solution. Once the etching of the pores has reached the required depth, the HF solution is discarded.

The liner material may then be removed from the front-side of the wafer after pore formation. The liner may be removed by using wet etching techniques such as using hot phosphoric acid if the liner is silicon nitride or using hydrofluoric acid if the liner is silicon dioxide. Dry etching techniques, which are described above, may also be used.

At 640, some of the silicon on the backside of the silicon wafer may be removed to expose the porous silicon pumping medium 100. The silicon may be removed using standard etching techniques, such as plasma reactive ion etching, lapping or chemical-mechanical polishing. Finally, at 645, a liner material may be deposited on top of the porous silicon substrate and within the pores of the porous silicon. In some embodiments, the liner material may be $SiO_2$, which may be created by thermally oxidizing the porous silicon. Alternatively, the $SiO_2$ may be deposited within the pores by first depositing at least one layer of nitride through low pressure chemical vapor deposition (LPCVD), or by adding at least one layer of polycrystalline silicon through LPCVD and then oxidizing the polycrystalline silicon layer through standard techniques. The liner material may also be a polymeric material such as parylene.

Figure 7:
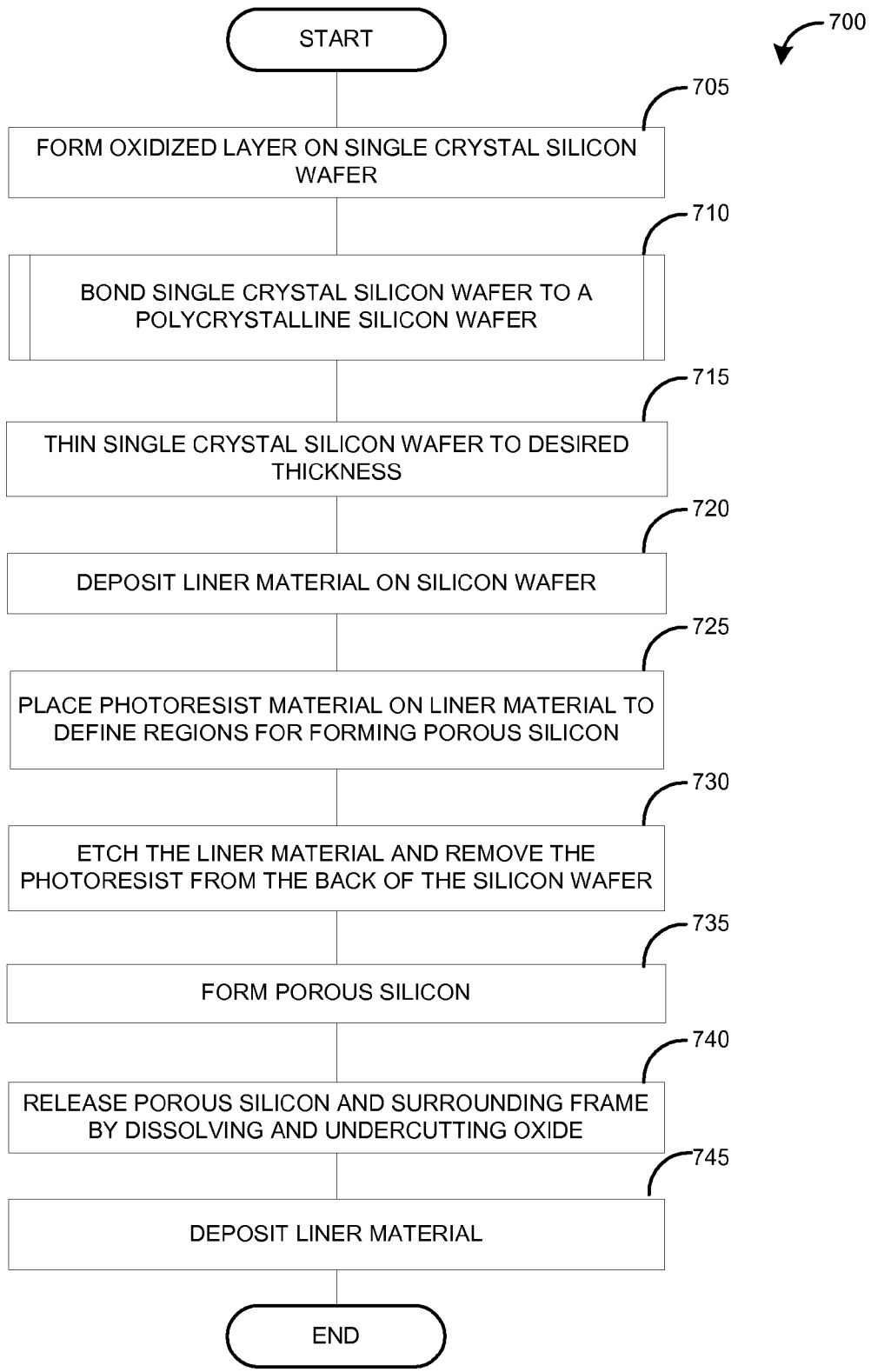
FIG. 7 is a logic flow diagram illustrating an alternative method for manufacturing porous silicon for use in electro-osmotic pumps in accordance with some embodiments of the present invention.

FIG. 7 is a logic flow diagram illustrating another method 700 for manufacturing porous silicon in accordance with some embodiments of the present invention. Whenever porous silicon is made on the order of less than 100 microns, the porous silicon wafer may become damaged when the backside of the silicon wafer is ground away to open the pores in the porous silicon. Another method for fabricating porous silicon may use the technique of bonding a silicon wafer to a polycrystalline wafer, which may act as a substrate during the formation of porous silicon. Once the porous silicon is formed, the polycrystalline silicon may be easily removed from the porous silicon wafer while reducing the number of porous silicon pumping mediums 100 that are damaged. Method 700 begins at 705, in which a single crystal silicon crystal may be bonded to a polycrystalline silicon wafer. A polycrystalline silicon wafer may first be fabricated by casting and directionally solidifying individual silicon crystals, which may be characterized by multicrystallinity and low cost. The fabrication of the polycrystalline silicon wafer is described in U.S. Pat. No. 6,406,981, issued on Jun. 18, 2002, and herein incorporated by reference. The polycrystalline silicon wafer may have a thickness in the range of approximately 700 microns to 750 microns. The thickness of the polycrystalline silicon wafer should be sufficient to provide a stable base for the formation of the porous silicon in the single crystalline silicon wafer. Next, a layer of oxide is formed on the single crystal silicon wafer by standard thermal deposition techniques. The oxide layer may have a thickness of up to approximately 1000 Angstroms (Å). An important factor is that the oxide layer should be of sufficient length to maintain the proper electrical resistance to allow porous silicon formation. If the resistance is too high, then one may not be able to produce enough current to generate the porous silicon. Although an oxide has been described as being the bonding material between the polycrystalline silicon and the single crystalline silicon wafer, other materials may be used, such as nitrides like silicon nitride ($SiN_2$) or carbon-based films without departing from the scope of the invention.

At 710, the single crystalline silicon wafer, which may have a thickness in the range of approximately 600 microns to 800 microns, may then be bonded to the polycrystalline silicon wafer. At 715, the single crystalline silicon wafer may be thinned down to a desired thickness. In some embodiments the single crystal silicon wafer may be thinned down to as little as 2 microns, however approximately 100 microns may be more typical for porous silicon. The silicon wafer may be thinned using standard grinding and polishing techniques. Next, at 720, a liner material may be deposited on the wafer in preparation for patterning the single crystal silicon wafer. Examples of liner materials may be thermally deposited oxides, such as silicon dioxide ($SiO_2$) nitrides, such as silicon nitride (SiN$_2$) that may be deposited on the silicon wafer using low pressure chemical vapor deposition (LPCVD) processes. However, those skilled in the art will appreciate that other insulating layers, such as titanium oxide (TiO$_2$), tin oxide (SnO$_2$), titanium nitride (TiN$_2$) and other oxides or nitrides may be used without departing from the scope of the invention.

At 725, a photoresist layer may be deposited on front side of the silicon wafer to define a pattern for forming the porous silicon pumping medium 100. The pattern may consist of an array of geometric regions, which may define the areas where the porous silicon may be formed. The geometric regions 410 may be separated by a number of rigid support regions 405 to provide additional strength to the porous silicon pumping medium 100. For example, in one embodiment, the geometric regions 410 may be rectangular in shape regions and may be separated by rigid support regions 405 of solid silicon to act as stiffener regions 405 to reinforce the porous silicon.

At 730, the liner material on the front of the silicon wafer may be removed to reveal the silicon where the porous silicon may be formed. The liner material may be etched using a wet etch technique or standard plasma etching techniques. Next, the photoresist layer may be removed using standard plasma/ash etch process or any other suitable process for removing photoresist films.

At 735, the porous silicon may be formed in the silicon wafer as describe above in FIG. 6. However, instead of stopping the formation of the pores before the pores reach the backside of the silicon wafer, the pores may be formed throughout the entire length of the silicon wafer. The formation of the porous silicon may be stopped by the SiO$_2$ layer, as the HF solution may not be reactive with the SiO$_2$ layer. At 740, the newly formed porous silicon may be removed from the polycrystalline silicon wafer by first grinding away the polycrystalline silicon wafer. Thus, the porous silicon may be formed without having to carefully grind the single crystalline silicon wafer to expose the pores. Next, the oxide may be etched away using standard chemical etching or plasma etching techniques. Finally, at 745, a liner material may be deposited within the pores of the porous silicon. In some embodiments, the liner material may be SiO$_2$, which may be created by thermally oxidizing the porous silicon. Alternatively, the SiO2 may be deposited within the pores by first depositing at least one layer of nitride through LPCVD, then adding at least one layer of polycrystalline silicon through LPCVD and then oxidizing the crystalline silicon layer through standard techniques.

Figure 8:
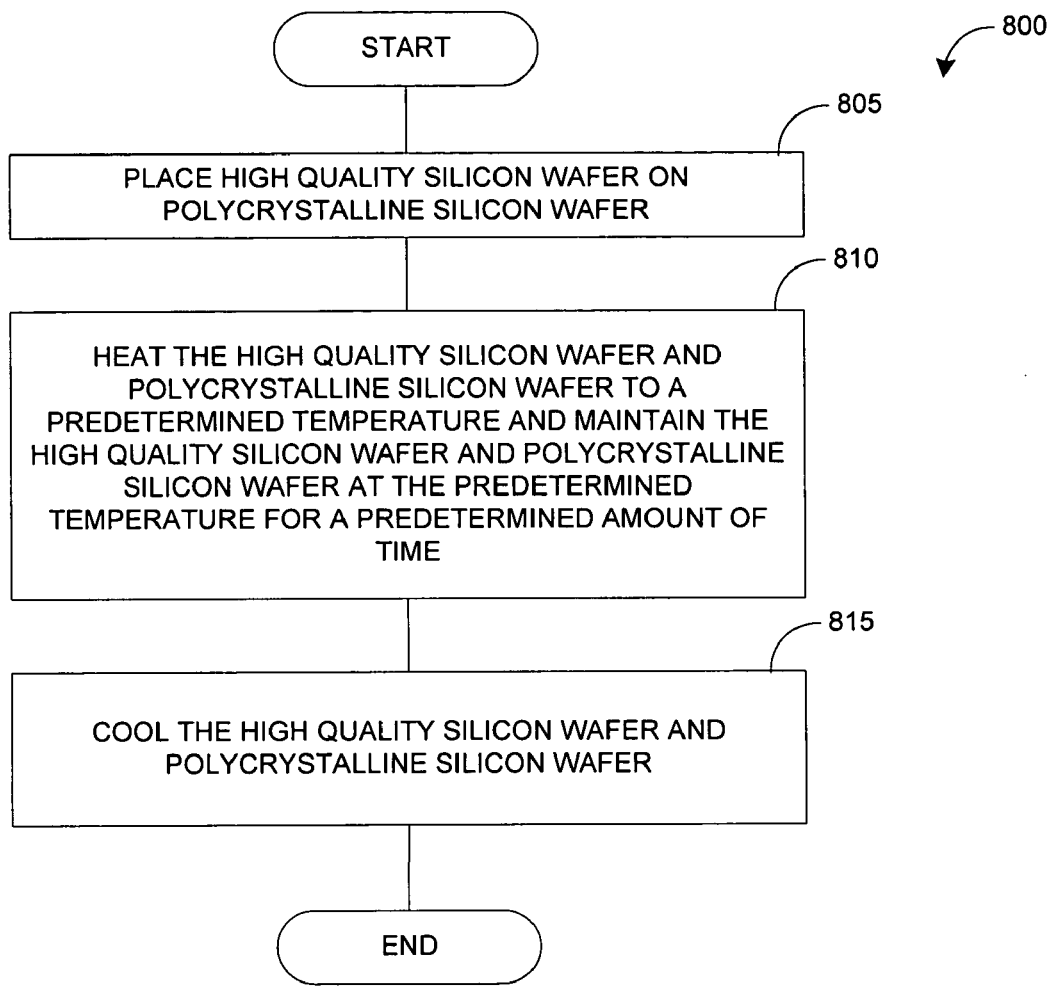
FIG. 8 is a logic flow diagram illustrating a method for bonding a single crystal silicon wafer to a polycrystalline silicon wafer in accordance with some embodiments of the present invention.

FIG. 8 illustrates a logic flow diagram illustrating a method 800 for bonding a single crystal silicon wafer onto the polycrystalline silicon wafer in accordance with some embodiments of the present invention. Method 800 begins at 805, in which the single crystal silicon wafer may be placed on the polycrystalline silicon wafer to be thermally fused to the oxide layer. At 810, once the single crystal silicon wafer is placed on top of the polycrystalline silicon, the wafer may be heated to a temperature in the range of approximately 600 degrees Celsius to approximately 900 degrees Celsius. In one embodiment, the wafer may be heated to approximately 800 degrees Celsius. Once the proper temperature has been reached, the wafer may be held at the appropriate temperature for a predetermined period of time to fuse the oxide to the single crystal silicon. In some embodiments, the predetermined time may be in the range of approximately 3 minutes to approximately 7 minutes and then allowed to cool. In one embodiment, the predetermined time that the wafer is held at the appropriate temperature may be approximately 5 minutes. Finally, at 815, the single crystal silicon wafer and polycrystalline silicon wafer may be cooled.

Figure 9:
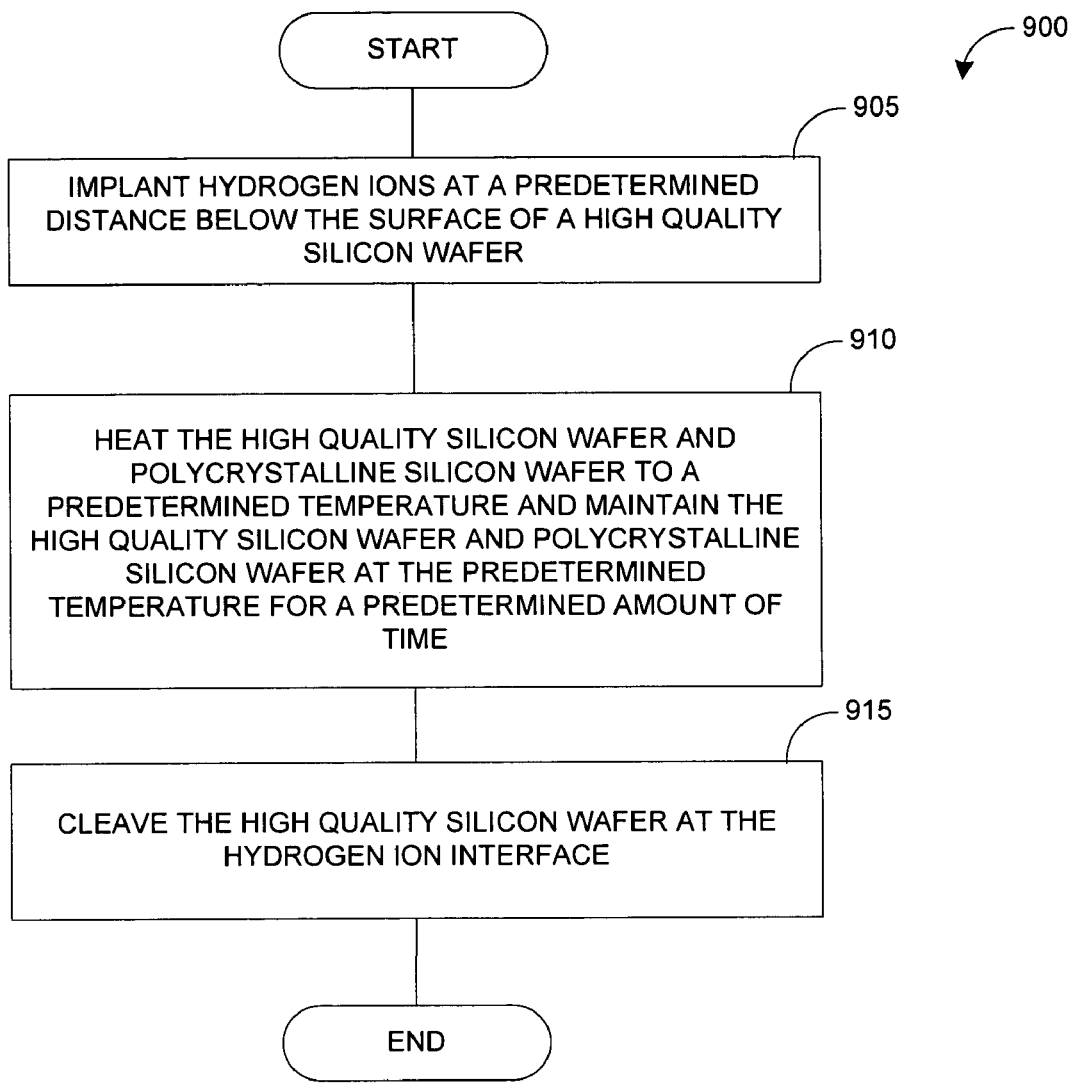
FIG. 9 is a logic flow diagram illustrating an alternative method for bonding a single crystal silicon wafer to a polycrystalline silicon wafer in accordance with some embodiments of the present invention.

FIG. 9 is an illustration of a logic flow diagram illustrating an alternative embodiment for bonding the single crystal silicon wafer to the polycrystalline silicon using a layer transfer process in accordance with some embodiments of the present invention. The method 900 begins at 905, in which the single crystal silicon wafer may have either hydrogen or helium ions implanted at a depth of approximately 2 microns below the surface of the silicon wafer. The hydrogen or helium ions may create voids at the depth below the surface, which may allow the silicon wafer to be cleaved at the location of the voids. At 910, the single crystal silicon wafer is fused to the polycrystalline silicon wafer, using the method described above in accordance with FIG. 8. At 915, once the single crystal silicon wafer is fused to the oxide layer, the single crystal silicon may be cleaved at the hydrogen or helium ion interface created by the implantation of hydrogen or helium ions. A thin wafer of the single crystal silicon may be left on the polycrystalline silicon wafer. The thin wafer of single crystal silicon may have a thickness of approximately 2-3 microns, depending on how deep the hydrogen or helium atoms may have been imbedded.

Other alternative embodiments will become apparent to those skilled in the art to which an exemplary embodiment pertains without departing from its spirit and scope. Accordingly, the scope of the present invention is defined by the appended claims rather than the foregoing description.

We claim:

1. A method, comprising:
   growing a layer of oxide on a single crystal silicon wafer;
   bonding the single crystal silicon wafer onto a polycrystalline silicon wafer at the oxide layer;
   depositing a liner material on the single crystal silicon wafer;
   etching a pattern in the liner material to define regions adapted to form porous silicon;
   forming porous silicon in the etched pattern; and
   separating the single crystal silicon wafer from the polycrystalline silicon wafer.

2. The method of claim 1, wherein bonding the single crystal silicon to the oxide layer comprises:
   placing the single crystal silicon wafer on the oxide layer on the polycrystalline silicon wafer;
   heating the single crystal silicon wafer and polycrystalline silicon wafer to a predetermined temperature; and
   maintaining the single crystal silicon wafer and polycrystalline silicon wafer at the predetermined temperature for a prescribed period of time.

3. The method of claim 1, wherein bonding the single crystal silicon to the oxide layer comprises:
   implanting hydrogen gas ions at a predetermined depth into the single crystal silicon wafer to form voids at the predetermined depth;
   placing the single crystal silicon wafer on the oxide layer on the polycrystalline silicon wafer;
   heating the single crystal silicon wafer and crystalline silicon wafer to a predetermined temperature;
   maintaining the single crystal silicon wafer and crystalline silicon wafer at the predetermined temperature for a prescribed period of time; and
   cleaving the single crystal silicon wafer at the predetermined depth.

4. The method of claim 1, wherein forming the porous silicon further comprises:
   passing current between electrodes across the back of the crystalline silicon wafer; and placing a solution comprising hydrofluoric acid (HF) on the top of the crystalline silicon and etching pores in the crystalline silicon at least part way through the crystalline silicon wafer.

5. The method of claim 1, further comprising, coating the porous silicon with an electrically insulating liner material.

6. The method of claim 5, wherein the electrically insulating liner material is selected from a list consisting essentially of an oxide, a nitride, or a polymer.

7. The method of claim 6, wherein the oxide comprises silicon dioxide.

8. The method of claim 4, wherein the solution comprising HF remains in contact with the crystalline silicon for a predetermined period of time in the range of approximately 1 to 400 minutes.

9. The method of claim 1 wherein etching the liner material comprises reducing the single crystal silicon to a predetermined thickness is in the range of approximately 0.1 to 10 microns.

10. The method of claim 1, wherein etching a pattern in the liner material, comprises placing a photoresist on the pattern, wherein the pattern comprises a plurality of geometric figures arranged in an array, wherein the sides of each geometric figure has a specified length and each geometric shape is separated from every other geometric shape by a predetermined distance.

11. The method of claim 10, wherein the specified length of each side of each geometric shape is approximate 2 microns.

12. The method of claim 10, wherein the predetermined distance is approximately 8 microns.

13. The method of claim 1, wherein forming porous silicon comprises placing the crystalline silicon in a potassium hydroxide (KOH) solution for a predefined amount of time.

14. The method of claim 2, wherein the predetermined temperature for heating the single crystal silicon wafer and polycrystalline silicon wafer is approximately 600 degrees Celsius.

15. The method of claim 2, wherein the prescribed period of time for maintaining the single crystal silicon wafer and polycrystalline silicon wafer at the predetermined temperature is approximately five minutes.

16. The method of claim 3, wherein the predetermined temperature for heating the single crystal silicon wafer and polycrystalline silicon wafer is approximately 600 degrees Celsius.

17. The method of claim 3, wherein the prescribed period of time for maintaining the single crystal silicon wafer and polycrystalline silicon wafer at the predetermined temperature is approximately five minutes.

18. The method of claim 3, wherein the predetermined depth for implanting hydrogen ions is approximately two microns.

* * * * *